(12) United States Patent
Srinivasan et al.

(10) Patent No.: US 12,366,605 B2
(45) Date of Patent: Jul. 22, 2025

(54) AREA, COST, AND TIME-EFFECTIVE SCAN COVERAGE IMPROVEMENT

(71) Applicant: STMicroelectronics International N.V., Geneva (CH)

(72) Inventors: Venkata Narayanan Srinivasan, Greater Noida (IN); Umesh Chandra Srivastava, Greater Noida (IN); Shiv Kumar Vats, Greater Noida (IN); Manish Sharma, Gurgaon (IN)

(73) Assignee: STMicroelectronics International N.V., Geneva (CH)

( * ) Notice: Subject to any disclaimer, the term of this patent is extended or adjusted under 35 U.S.C. 154(b) by 136 days.

(21) Appl. No.: 18/100,975

(22) Filed: Jan. 24, 2023

(65) Prior Publication Data
US 2024/0250668 A1   Jul. 25, 2024

(51) Int. Cl.
*G01R 31/3185* (2006.01)
*G01R 31/3187* (2006.01)

(52) U.S. Cl.
CPC ........ *G01R 31/318544* (2013.01); *G01R 31/318536* (2013.01); *G01R 31/318541* (2013.01); *G01R 31/318597* (2013.01); *G01R 31/3187* (2013.01)

(58) Field of Classification Search
CPC .... G01R 31/318536; G01R 31/318541; G01R 31/318544; G01R 31/318597; G01R 31/3187
See application file for complete search history.

(56) References Cited

U.S. PATENT DOCUMENTS

| | | | |
|---|---|---|---|
| 7,428,676 B2 | 9/2008 | Kashiwagi | |
| 7,900,107 B2 | 3/2011 | Chen et al. | |
| 7,949,916 B1 | 5/2011 | Ang | |
| 8,205,125 B2 | 6/2012 | Hales et al. | |
| 8,434,042 B2 | 4/2013 | Ishikawa | |
| 10,909,291 B2 | 2/2021 | Wu et al. | |
| 2009/0212818 A1 | 8/2009 | Sakai et al. | |
| 2010/0293424 A1 | 11/2010 | Katagi et al. | |
| 2013/0254609 A1 | 9/2013 | Yonetoku | |
| 2021/0109153 A1* | 4/2021 | Waayers | G06F 30/333 |
| 2021/0357567 A1 | 11/2021 | Sherlekar et al. | |

OTHER PUBLICATIONS

Mukherjee, Nilanjan, "Test Time and Area Optimized BIST Scheme for Automotive ICs," IEEE International Test Conference, Washington, DC, USA Nov. 9-15, 2019, 10 pages.

* cited by examiner

*Primary Examiner* — Patrick O Neill
(74) *Attorney, Agent, or Firm* — Slater Matsil, LLP (57) ABSTRACT

According to an embodiment, a digital circuit includes an OR gate and a flip-flop. The OR gate includes a first input and a second input. The first input of the OR gate is coupled to a control signal, and the second input of the OR gate is coupled to an uncovered functional combination logic of the digital circuit. The first input of the OR gate is configured to be pulled low by the control signal in response to setting the digital circuit in a configuration to test the uncovered functional combination logic. The flip-flop includes a reset pin or a set pin coupled to the output of the OR gate. The output of the flip-flop is configured to be observed during a testing of the uncovered functional combination logic to detect defects in the digital circuit.

20 Claims, 7 Drawing Sheets

--PRIOR ART--

AREA, COST, AND TIME-EFFECTIVE SCAN COVERAGE IMPROVEMENT

TECHNICAL FIELD

The present disclosure generally relates to digital logic and, in particular embodiments, to an improved area, cost, and time-effective scan coverage as applied to digital logic.

BACKGROUND

Generally, design for testability (DFT) techniques, such as automatic test pattern generation (ATPG) or logic built-in self-test (LBIST), are used to test a digital circuit. DFT allows, for example, the detection of manufacturing defects, the assisting in detecting fault locations, and the like.

ATPG is a computer-aided design (CAD) technique that automatically generates test patterns for a digital circuit. The randomly generated test patterns are used to verify the proper functioning and identify defects or faults in the digital circuit. ATPG uses external test equipment to verify the correct fabrication of the circuit.

LBIST uses built-in circuits to perform tests on the digital circuit. With LBIST, test patterns are generated and applied within the circuit (i.e., no external test equipment is needed). The test results are then compared to the expected results to determine the proper functioning of the circuit. LBIST can test the circuit's functionality at various stages of its operation, including during power-up, normal operation, or low-power mode.

Scan-design is commonly used to test an internal circuit under test (CUT). The external input/output (I/O) of the larger circuit—to which the CUT belongs—is used to deliver test data and observe the corresponding test outputs. Various flip-flops of the circuit are connected to one or more scan chains, and test patterns are shifted from the I/O pins through the scan chains. The test results are shifted out to the I/O pins and compared to an expected result to determine circuit defects.

Generally, the conventional scan-design techniques fail to test for all points in the circuit, and some functional combination logic circuits are not covered during the test (i.e., less than 100% coverage). Various solutions have been proposed to cure this deficiency, such as adding observability flip-flops or synchronized gate logic to the scan chain or using expensive software simulation tools. These solutions add unwanted circuit delay, cost, test time, and the like. An improvement to DFT techniques used to test functional combinational logic circuit of the digital circuit not typically covered using conventional scan-design techniques is, thus, desirable.

SUMMARY

Technical advantages are generally achieved by embodiments of this disclosure which describe an improved area, cost, and time-effective scan coverage as applied to digital logic.

A first aspect relates to a digital circuit. The digital circuit includes an OR gate and a flip-flop. The OR gate includes a first input and a second input. The first input of the OR gate is coupled to a control signal, and the second input of the OR gate is coupled to an uncovered functional combination logic of the digital circuit. The first input of the OR gate is configured to be pulled low by the control signal in response to setting the digital circuit in a configuration to test the uncovered functional combination logic. The flip-flop includes a reset pin or a set pin coupled to the output of the OR gate. The output of the flip-flop is configured to be observed during a testing of the uncovered functional combination logic to detect defects in the digital circuit.

In a first implementation form of the digital circuit according to the first aspect as such, in response to the reset pin or the set pin being pulled high during the testing of the uncovered functional combination logic, a last scan shift value of the flip-flop is overridden, and a stuck-at "1" fault condition is observed for the uncovered functional combination logic at the output of the flip-flop.

In a second implementation form of the digital circuit according to the first aspect as such or any preceding implementation form of the first aspect, in response to the reset pin or the set pin remaining low during the testing of the uncovered functional combination logic, a last scan shift value of the flip-flop is retained, and a stuck-at "0" fault condition is observed for the uncovered functional combination logic at the output of the flip-flop.

In a third implementation form of the digital circuit according to the first aspect as such or any preceding implementation form of the first aspect, the flip-flop is a boundary scan flip-flop or a control flip-flop of the digital circuit.

In fourth implementation form of the digital circuit according to the first aspect as such or any preceding implementation form of the first aspect, the flip-flop is a resettable functional flip-flop of the digital circuit.

In a fifth implementation form of the digital circuit according to the first aspect as such or any preceding implementation form of the first aspect, the digital circuit further includes a multiplexer, a one-hot decoder circuit, a second flip-flop, and a second OR gate.

The multiplexer includes a first input and a second input. The first input is coupled to a pad of the digital circuit, and the second input is coupled to an LBIST control signal. An output of the multiplexer is coupled to the LBIST control signal during LBIST in response to setting the digital circuit in the configuration to test the uncovered functional combination logic. The output of the multiplexer is coupled to a pad of the digital circuit during ATPG functions.

The one-hot decoder circuit is configured to generate a first clock signal and second clock signals provided to the rest of the digital circuit.

The second flip-flop includes a clock input, a data input, and an output. The clock input is coupled to the output of the one-hot decoder circuit and configured to receive the first clock signal. The data input is coupled to the output of the multiplexer.

The second flip-flop includes a clock input, a data input, and an output. The clock input of the second flip-flop is coupled to the output of the one-hot decoder circuit, and the data input of the second flip-flop is coupled to the output of the multiplexer.

The second OR gate is coupled to the output of the second flip-flop. The second OR gate is configured to generate the control signal in response to setting the digital circuit in the configuration to test the uncovered functional combination logic.

In a sixth implementation form of the digital circuit according to the first aspect as such or any preceding implementation form of the first aspect, the digital circuit further includes a multiplexer arranged between the output of the OR gate and the reset pin or the set pin of the flip-flop. The multiplexer is configured to couple the OR gate to the flip-flop in response to setting the digital circuit in the configuration to test the uncovered functional combination logic.

A second aspect relates to a digital circuit. The digital circuit includes an XOR tree, a plurality of OR gates, and a plurality of boundary scan flip-flops. The XOR tree includes a plurality of inputs; each input coupled to an associated uncovered functional combination logic. Each OR gate has a first input coupled to a control signal and a second input coupled to an associated output of the XOR tree. The control signal is pulled low in response to setting the digital circuit in a configuration to test the associated uncovered functional combination logic. Each boundary scan flip-flop has a reset pin or a set pin coupled to an associated OR gate. The output of each boundary scan flip-flop is configured to be observed during testing the associated uncovered functional combination logic to detect defects in the digital circuit.

In a first implementation form of the digital circuit according to the second aspect as such, each input of the XOR tree is coupled to the associated uncovered functional combination logic of the digital circuit at a periphery of the digital circuit.

In a second implementation form of the digital circuit according to the second aspect as such or any preceding implementation form of the second aspect, the digital circuit further includes a multiplexer, a one-hot decoder circuit, a second flip-flop, and a control OR gate.

The multiplexer includes a first input and a second input. The first input is coupled to a pad of the digital circuit, and the second input is coupled to an LBIST control signal. An output of the multiplexer is coupled to the LBIST control signal during LBIST in response to setting the digital circuit in the configuration to test the uncovered functional combination logic. The output of the multiplexer is coupled to a pad of the digital circuit during ATPG functions.

The one-hot decoder circuit is configured to generate a first clock signal and second clock signals provided to the rest of the digital circuit.

The second flip-flop includes a clock input, a data input, and an output. The clock input is coupled to the output of the one-hot decoder circuit and configured to receive the first clock signal. The data input is coupled to the output of the multiplexer.

The control OR gate is coupled to the output of the second flip-flop and is configured to generate the control signal in response to setting the digital circuit in the configuration to test the associated uncovered functional combination logic.

In a third implementation form of the digital circuit according to the second aspect as such or any preceding implementation form of the second aspect, in response to the reset pin or the set pin being pulled high during the testing of the associated uncovered functional combination logic, a last scan shift value of a respective boundary scan flip-flop is overridden, and a stuck-at "1" fault condition is observed for the associated uncovered functional combination logic at the output of the respective boundary scan flip-flop.

In a fourth implementation form of the digital circuit according to the second aspect as such or any preceding implementation form of the second aspect, in response to the reset pin or the set pin remaining low during the testing of the associated uncovered functional combination logic, a last scan shift value of the respective boundary scan flip-flop is retained, and a stuck-at "0" fault condition is observed for the associated uncovered functional combination logic at the output of the respective boundary scan flip-flop.

In a fifth implementation form of the digital circuit according to the second aspect as such or any preceding implementation form of the second aspect, the digital circuit further includes a plurality of multiplexers arranged between the output of each OR gate and the reset pin or the set pin of the respective boundary scan flip-flop. A respective multiplexer is configured to couple each OR gate to the respective boundary scan flip-flop in response to setting the digital circuit in the configuration to test the associated uncovered functional combination logic.

In a sixth implementation form of the digital circuit according to the second aspect as such or any preceding implementation form of the second aspect, the digital circuit further includes a control flip-flop configured to test an associated uncovered functional combination logic of the digital circuit coupled to a digital input of an analog IP using a scan chain.

A third aspect relates to a digital circuit. The digital circuit includes a multiplexer, an OR gate, a first functional combination logic circuit, a second functional combination logic circuit and a control flip-flop.

The OR gate includes a first input coupled to a control signal. The first functional combination logic circuit is coupled to a first input of the multiplexer and a second input of the OR gate. The control signal is pulled low in response to setting the digital circuit in a configuration to test the first functional combination logic circuit. The second functional combination logic circuit is coupled to the output of the multiplexer, and the second functional combination logic circuit is configured to receive the output of the first functional combination logic circuit during a functional mode operation or an analog IP test mode operation of the digital circuit, and receive a tied safe state value during a scan mode of the digital circuit to keep the analog IP in a power down state. The control flip-flop includes a reset pin or a set pin coupled to the output of the OR gate. The control flip-flop is configured to be observed during the testing of the first functional combination logic circuit to detect defects in the digital circuit.

In a first implementation form of the digital circuit according to the third aspect as such, the digital circuit further includes a second multiplexer having a first input coupled to the digital output of the second functional combination logic circuit and a second input coupled to the output of the control flip-flop.

In a second implementation form of the digital circuit according to the third aspect as such or any preceding implementation form of the third aspect, the second functional combination logic circuit is an analog IP, and the first functional combination logic circuit drives the digital input of analog IP.

In a third implementation form of the digital circuit according to the third aspect as such or any preceding implementation form of the third aspect, the analog IP is one of an analog to digital converter, a power management block, a flash, a fuse, a clock source, a threshold detector, or a process monitor.

In a third implementation form of the digital circuit according to the third aspect as such or any preceding implementation form of the third aspect, in response to the reset pin or the set pin being pulled high during the testing of the first functional combination logic circuit, the digital circuit is configured to override a last scan shift value of the control flip-flop, and observe a stuck-at "1" fault condition for the first functional combination logic circuit at the output of the control flip-flop. In response to the reset pin or the set pin remaining low during the testing of the first functional combination logic circuit, the digital circuit is configured to retain a last scan shift value of the control flip-flop, and observe a stuck-at "0" fault condition for the first functional combination logic circuit at the output of the control flip-flop.

In a fourth implementation form of the digital circuit according to the third aspect as such or any preceding implementation form of the third aspect, the digital circuit further includes a second multiplexer, a one-hot decoder circuit, a second flip-flop, and a control OR gate.

The second multiplexer includes a first input and a second input. The first input is coupled to a pad of the digital circuit, and the second input is coupled to an LBIST control signal. An output of the second multiplexer is coupled to the LBIST control signal during LBIST in response to setting the digital circuit in the configuration to test the uncovered functional combination logic. The output of the second multiplexer is coupled to a pad of the digital circuit during ATPG functions.

The one-hot decoder circuit is configured to generate a first clock signal and second clock signals provided to the rest of the digital circuit.

The second flip-flop includes a clock input, a data input, and an output. The clock input is coupled to the output of the one-hot decoder circuit and configured to receive the first clock signal. The data input is coupled to the output of the second multiplexer.

The control OR gate is coupled to the output of the second flip-flop. The control OR gate is configured to generate the control signal in response to setting the digital circuit in the configuration to test the first functional combination logic circuit.

Embodiments can be implemented in hardware, software, or in any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described in one of the embodiments may also apply to others. Further, various changes, substitutions, and alterations can be made herein without departing from the spirit and scope of this disclosure as defined by the appended claims.

In embodiments, a digital circuit includes an OR gate and an existing flip-flop. An input of the OR gate is coupled to a control signal. A second input of the OR gate is coupled to a functional combination logic circuit of the digital circuit not covered during the scan mode testing of the digital circuit. The control signal is configured to be pulled low in response to setting the digital circuit in a configuration to test the uncovered functional combination logic. The OR gate is coupled to a reset pin or set pin of the existing flip-flop. The output of the flip-flop is observed during the testing of the uncovered functional combination logic to detect defects in the digital circuit.

In embodiments, in response to the reset pin or the set pin being pulled high during the testing of the uncovered functional combination logic, the last scan shift value of the flip-flop is overridden, and a stuck-at "1" fault condition is observed for the uncovered functional combination logic at the output of the flip-flop.

In embodiments, in response to the reset pin or the set pin remaining low during the testing of the uncovered functional combination logic, the last scan shift value of the flip-flop is retained, and a stuck-at "0" fault condition is observed for the uncovered functional combination logic at the output of the flip-flop.

In embodiments, the flip-flop selected during the digital circuit design is a boundary scan flip-flop when the logic to be scanned (i.e., observation logic) is near an output pad of the digital circuit.

In embodiments, the flip-flop selected during the digital circuit design is a control flip-flop of the digital circuit when the logic to be scanned is within the core logic of the digital circuit.

Aspects of this disclosure provide a control circuit to generate the control signal coupled to the first input of the OR gate. The control circuit includes a multiplexer, a one-hot decoder circuit, a second flip-flop, and a second OR gate. The multiplexer includes a first input coupled to a pad of the digital circuit used as control for ATPG operations, and a second input coupled to an LBIST control signal.

During LBIST operations the output of the multiplexer is coupled to the LBIST control signal in response to setting the digital circuit in the configuration to test the uncovered functional combination logic. The output of the multiplexer is coupled to the pad of the digital circuit in all other conditions and used in ATPG operations to set the digital circuit in the configuration to test the uncovered functional combination logic.

The one-hot decoder circuit is configured to generate a clock signal received at a clock input of the second flip-flop.

The data input of the second flip-flop is coupled to the output of the multiplexer. The second OR gate is coupled to the output of the second flip-flop. The second OR gate is configured to generate the control signal in response to setting the digital circuit in the configuration to test the uncovered functional combination logic.

In embodiments, the digital circuit includes a multiplexer arranged between the output of the OR gate and the reset pin or the set pin of the flip-flop. The multiplexer is configured to couple the OR gate to the flip-flop in response to setting the digital circuit in the configuration to test the uncovered functional combination logic. These and other details are further detailed below.

As described above, the conventional scan-design techniques fail to test for all points in the circuit. Various industries require a circuit with a minimum coverage target during various test modes. For example, the automotive industry has a minimum stuck-at coverage target requirement of 99% for production (i.e., ATPG) and 90% for self-test (i.e., LBIST at customer environment). Embodiments of this disclosure provide an advantageous method and structure to test uncovered functional combination logic.

Figure 1:
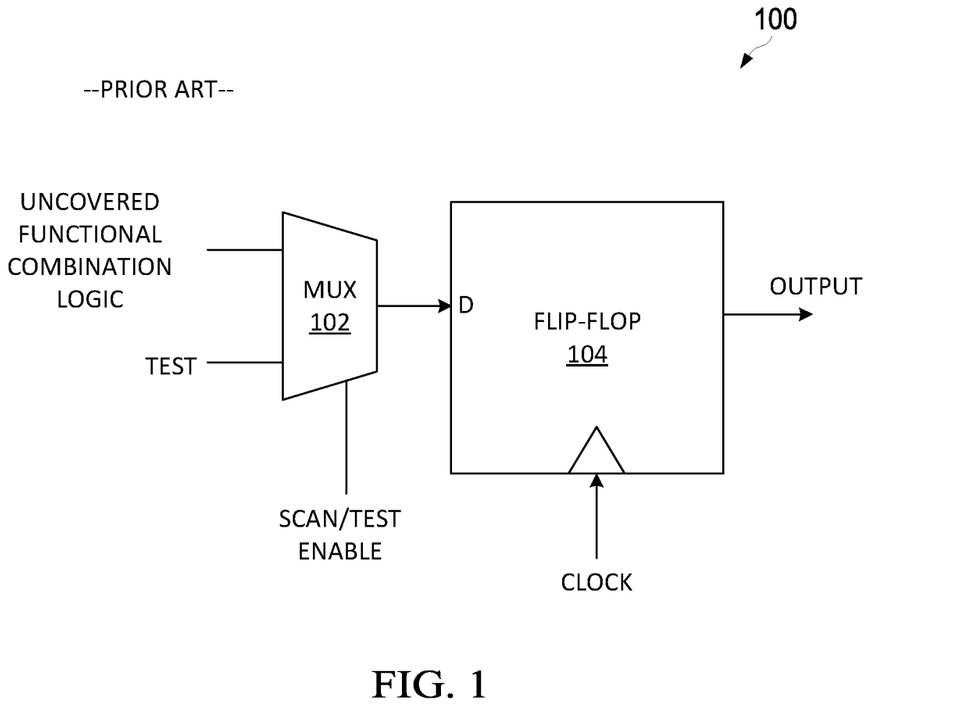
FIG. 1 is a block diagram of a conventional scan flip-flop of a scan chain.

FIG. 1 illustrates a block diagram of a conventional scan flip-flop 100 of a scan chain. The scan flip-flop 100 includes a multiplexer 102 coupled with a flip-flop 104. Multiple scan flip-flops are arranged in a scan chain to test one or more logic components in the digital circuit using ATPG or LBIST techniques.

Multiplexer 102 includes a functional input, a test input, a scan/test enable input, and an output. The value at the scan/test enable input determines which of the functional input or test input is selected at the output of the multiplexer 102. The functional input is coupled to the digital circuit's uncovered functional combinational logic circuit. A clock signal is used to control the scan flip-flop 100 along the scan chain. The output of the flip-flop 104 provides the result of the test pattern for the portion of the CUT coupled to the scan flip-flop 100.

As shown, during scan mode (i.e., when the scan/test enable input is asserted), portions of the functional combination logic of the CUT are not verified. For example, portions of the CUT driving the analog inputs (IP) and the pad inputs of the CUT are not tied to the test input of multiplexer 102. Typical analog IP includes analog to digital converters (ADC) (e.g., successive successive-approximation ADC), power management blocks, flash, fuse, clock sources (e.g., phase-locked loop, crystal oscillators, RC oscillators), threshold detectors, process monitors, and the like. Thus, a portion of the CUT arranged before, for example, the analog IP is lost during the conventional scan-mode.

Figure 2:
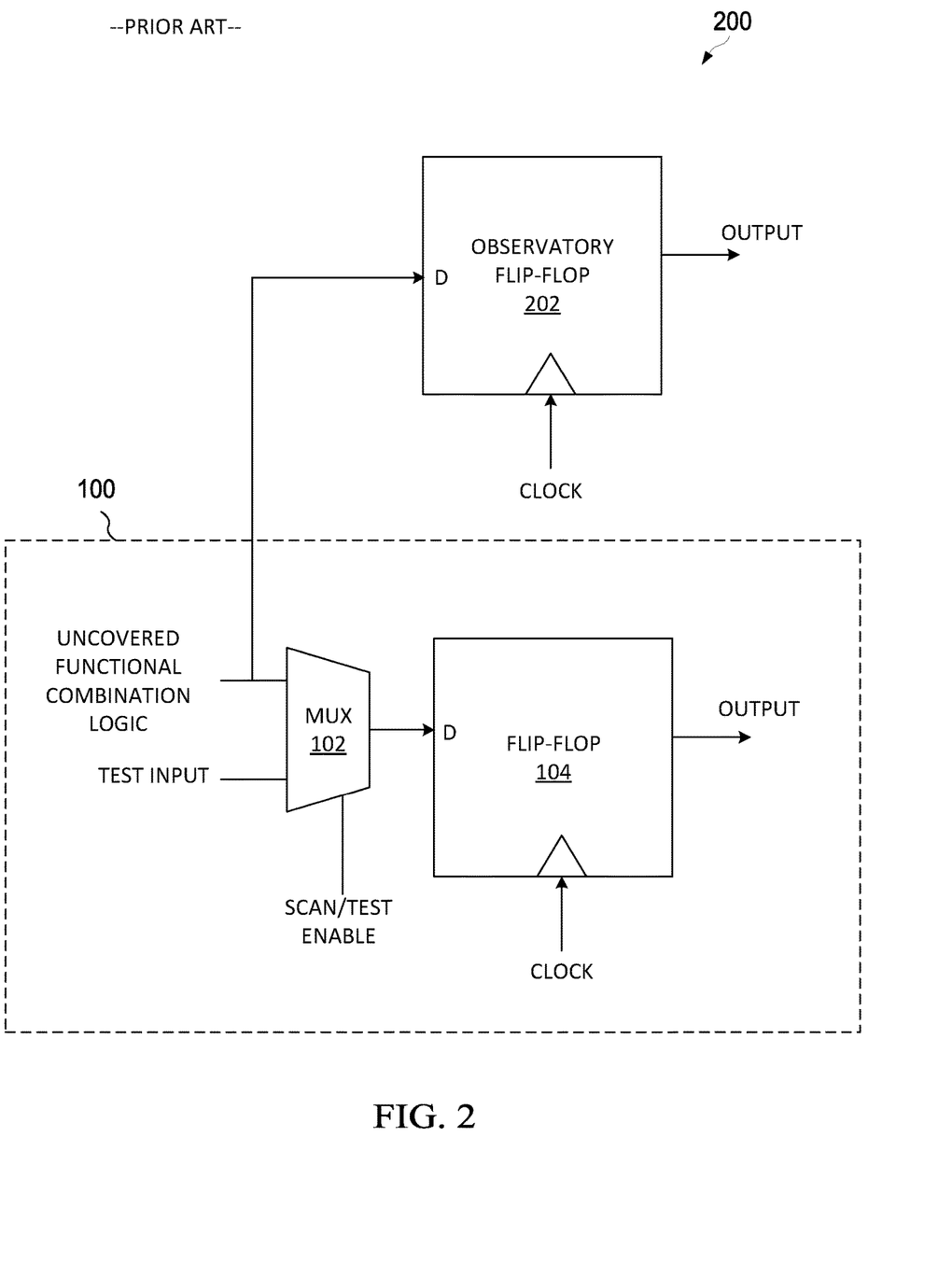
FIG. 2 is a block diagram of a circuit, which includes a scan flip-flop in combination with an observability flip-flop.

FIG. 2 illustrates a block diagram of circuit 200, which includes a scan flip-flop 100 in combination with an observability flip-flop 202. Circuit 200 is a first prior art solution to test uncovered functional combinational logic. In circuit 200, the uncovered functional combinational logic of the CUT is tied to the data (D) input of the observability flip-flop 202. By comparing the output of the observability flip-flop 202 to an expected value, the uncovered functional combinational logic is, thus, tested.

Disadvantageously, observability flip-flop 202 is added for structural testing of the uncovered functional combinational logic and provides no other functional purposes. Adding the observability flip-flop 202 to the scan chain increases cost, circuit footprint, scan chain length, test time, and self-test time (i.e., LBIST) in the application environment.

For example, each observability flip-flop 202 adds an additional cycle to a scan chain. A typical digital circuit can include many observability flip-flops due to the many scan chains. In a scan chain that includes a hundred flip-flops, the observability flip-flop 202 adds an additional clock cycle to the test sequence. As a digital circuit may include thousands of flip-flops, adding the observability flip-flop 202 to each scan chain increases test time.

Further, each observability flip-flop 202 requires a clock signal for synchronicity, and corresponding patterns to meet setup and hold requirements are, thus, needed, which adds cost, time, and circuit footprint. Moreover, adding an observability flip-flop 202 along the functional path of the digital circuit adds unwanted delay time to the functional operations of the digital circuit.

Figure 3:
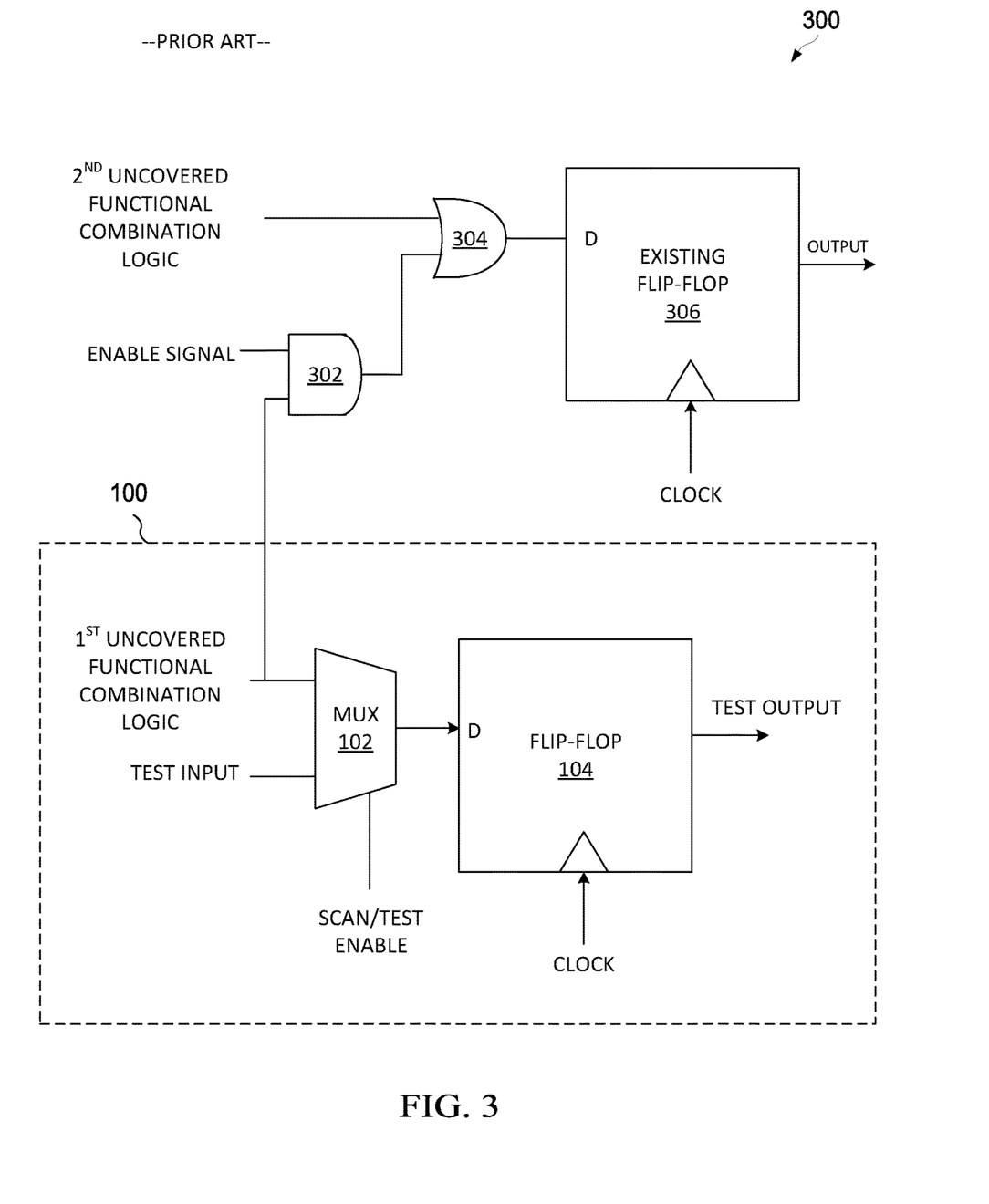
FIG. 3 is a block diagram of a circuit, a second prior art solution used to test uncovered functional combination logic.

FIG. 3 illustrates a block diagram of circuit 300, a second prior art solution used to test uncovered functional combination logic. As shown, instead of adding the observability flip-flop 202, a first uncovered functional combination logic is coupled to the data (D) pin of an existing functional flip-flop 306 through an AND gate 302 and an OR gate 304; a second uncovered functional combination logic is coupled to a second input of the OR gate 304.

During functional mode (i.e., when scan mode is disabled), the first input to the AND gate 302 is at a logic low (i.e., "0"). As a result, the output of the AND gate 302 and the first input to the OR gate 304 is at a logic low. Thus, the input to the existing functional flip-flop 306 is the second uncovered functional combination logic received at the second input of the OR gate 304. In embodiments, the functional flip-flop 306 is an existing flip-flop used in the circuit tied to the second uncovered functional combination logic.

During scan mode, the first input to the AND gate 302 is at a logic high (i.e., "1"). As a result, the first and second uncovered functional combination logic circuits can be tested. To test the first uncovered functional combination logic, the LBIST controller (e.g., field-programmable gate array (FPGA) sets the second uncovered functional combination logic to zero, and to test the second uncovered functional combination logic, the LBIST controller sets the first uncovered functional combination logic to zero. The input to the existing functional flip-flop 306 is, thus, one of the first or second uncovered functional combination logics based on the LBIST controller setting.

In circuit 300, the additional gates add unwanted delay along the high-frequency functional paths. Further, the test pattern count is increased by switching between the functional paths, which increases test time. Finally, the additional logic adds complexity, which increases costs.

As a third solution, expensive software simulation tools can be used to test the uncovered functional combination logic. The software uses various simulations to check patterns not covered in scan mode. In addition to the added expense, the software is usually not adaptable to custom patterns, which could add constraints to the circuit design.

Figure 4:
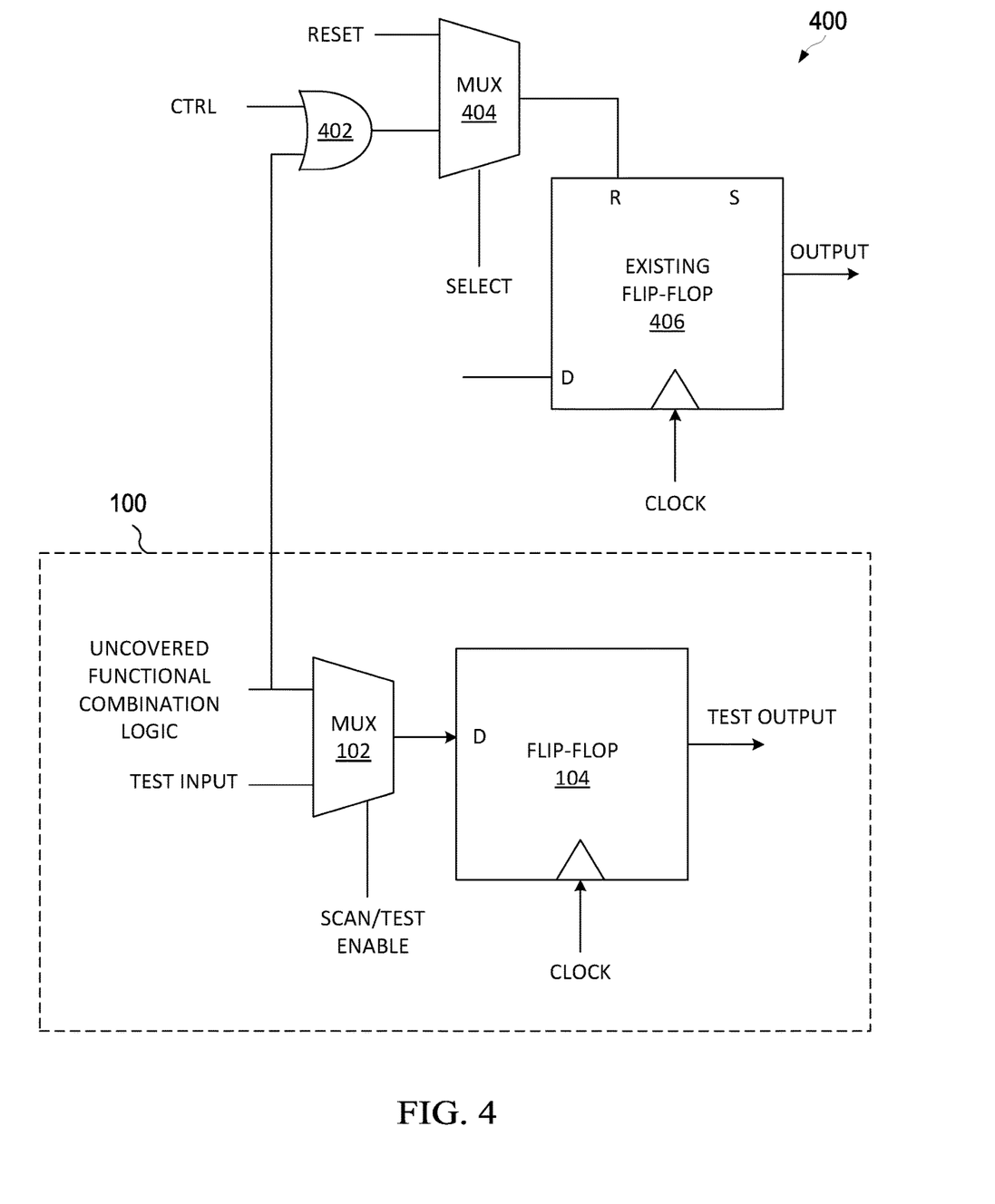
FIG. 4 is a block diagram of an embodiment circuit for testing uncovered functional combination logic of a digital circuit.

FIG. 4 illustrates a block diagram of an embodiment circuit 400 for testing uncovered functional combination logic of a digital circuit. Circuit 400 includes the scan flip-flop 100, an OR gate 402, a multiplexer 404, and an existing D (i.e., Data or Delay) flip-flop 406, which may (or may not) be arranged as shown. Further, circuit 400 may include additional components not shown in FIG. 4.

The uncovered functional combination logic is coupled to a first input of OR gate 402. A control signal is received at the second input of OR gate 402—detailed further below. The output of OR gate 402 is coupled to the first input of multiplexer 404. The second input of multiplexer 404 is coupled to a reset path used to reset the existing D flip-flop 406. The output of the multiplexer 404 is coupled to the reset (R) pin or a set (S) pin of an existing D flip-flop 406. Thus, although the output of multiplexer 404 is coupled to the reset (R) pin of the existing D flip-flop 406 in FIG. 4, the output of multiplexer 404 can be coupled to the set (S) pin of the existing D flip-flop 406 in other embodiments.

When the existing D flip-flop 406 is already configured to receive a reset signal, an optional multiplexer 404 couples the OR gate 402 to the reset (R) pin of the existing D flip-flop 406. In such an embodiment, the enable signal fed to the multiplexer 404 allows a selection between (i) the original reset signal during the functional mode or (ii) the original reset signal or uncovered functional combination logic in the test mode at the reset (R) pin of the existing D flip-flop 406.

During scan mode, the original reset signal or uncovered functional combination logic is coupled to the reset (R) pin of the existing D flip-flop 406 based on the particular scan capture operation performed during a scan capture. During normal operation, the reset (R) pin of the existing D flip-flop 406 is coupled to the original reset path of the circuit through multiplexer 404.

In embodiments, the existing D flip-flop 406 is an existing boundary scan flip-flop of the digital circuit. The existing D flip-flop 406 is an existing boundary scan flip-flop when the logic to be scanned (i.e., observation logic) is "near" an output pad of the digital circuit. The uncovered functional combination logic is "near" an existing boundary scan flip-flip when it is used to drive an enable or data pad of the digital circuit in functional mode (i.e., non-boundary scan mode). The distance may vary based on the functional timing requirements of the sub-circuit, such as controller area network (CAN) protocols for CAN pads, local interconnect network (LIN) protocols for LIN pads, or the like.

A boundary scan flip-flop is a digital logic element specifically designed for boundary scan testing of the digital circuit. In boundary scan testing, a series of flip-flops are placed around the periphery of the digital circuit. The input and output of each flip-flop are, thus, accessible through a test interface. The boundary scan flip-flop allows the digital circuit to be tested by applying a set of test patterns to the input of the flip-flop. The resulting output patterns of the flip-flop are then observed to check for defects or faults. Generally, boundary scan flip-flops are used in complex or large circuits where the traditional functional test or built-in test methods are unavailable.

Generally, boundary scan-flops are added to a digital circuit to support 1149.1 standard operations. In these operations, the enable signals at the I/O pads are driven by the boundary scan flip-flops to configure pads as output or input, and data signals at the I/O pads are driven by the boundary scan flip-flops when the pads are configured as output and data signals at the I/O pads are observed when the pads are used as an input by the boundary scan flip-flops (e.g., during board level testing)

Boundary scan flip-flops are available in all digital circuits for general purpose input output (GPIO) parametric and board testing (i.e., customer boards).

In other embodiments, the existing D flip-flop 406 is an existing control flip-flop of the digital circuit. The existing D flip-flop 406 is an existing control flip-flop when the functional combination logic to be scanned is within the core logic of the digital circuit.

The functional combination logic is said to be within the core logic of the digital circuit when it is not used to drive an output pad or observe an input pad. For example, the functional combination logic between two flip-flops or the functional combination logic to an analog IP or from an analog IP is within the core logic of the digital circuit.

Generally, a control flip-flop is a configurable flip-flop added to a digital circuit to improve scan coverage. As a control flip-flop is part of the scan chain, it is a configurable flip-flop. For example, a control flip-flop is added to an output of non-scan blocks (i.e., for digital outputs of analog IPs) to improve scan coverage. As another example, a control flip-flop is added during LBIST design to further control functional combination logic between two flip-flops to counter less effective (when compared to deterministic ATPG patterns) pseudo-random LBIST patterns.

For example, uncovered functional combination logic can be coupled to a reset (R) pin of a test point register used for observability. Conventionally, a test point register is added only for controllability while an observability flip-flop is added only for observability (i.e., test observation), previously designed as non-resettable flip-flops.

Embodiments of this disclosure remove the need for an observability flip-flop and replace the non-resettable test point register with a resettable control flip-flop. Advantageously, this allows the resettable control flip-flop to be used for controllability and observability.

In embodiments, the existing D flip-flop 306 is an existing functional flip-flop. Generally, an existing functional flip-flop is resettable with the original reset pin connected to an associated reset signal. As described herein, a multiplexer may be used to retain the original reset signal for the existing functional flip-flop while still being able to couple the reset pin to the uncovered functional combination logic test output.

During test mode, the uncovered functional combination logic is coupled to the reset (R) pin of the existing D flip-flop 406 when selected based on a signal that determines a particular scan capture operation performed during a scan capture. In response to the reset (R) pin being asserted, the last scan shift value of the existing D flip-flop 406 is overridden. The reset condition at the output of the existing D flip-flop 406 is observed on the scan-out pin in the subsequent scan shift, which indicates a stuck-at "1" fault condition for the uncovered functional combination logic.

In response to the reset (R) pin not being asserted, the last scan shift value of the existing D flip-flop 406 is retained. The reset condition at the output of the existing D flip-flop 406 is observed on the scan-out pin in the subsequent scan shift, which indicates a stuck-at "0" fault condition for the uncovered functional combination logic.

Advantageously, embodiments of this disclosure provide a solution that eliminates the observability flip-flop 202 and the resulting increased test time (see circuit 200), removes the need for setup and hold check circuitry for synchronicity (as an asynchronous solution is provided by the reset pin of the existing D flip-flop), eliminates delays in the functional path (see circuit 300) and avoids the need for expensive software simulation tools. Thus, embodiments of this disclosure minimize circuit delay and reduce circuit footprint.

Figure 5:
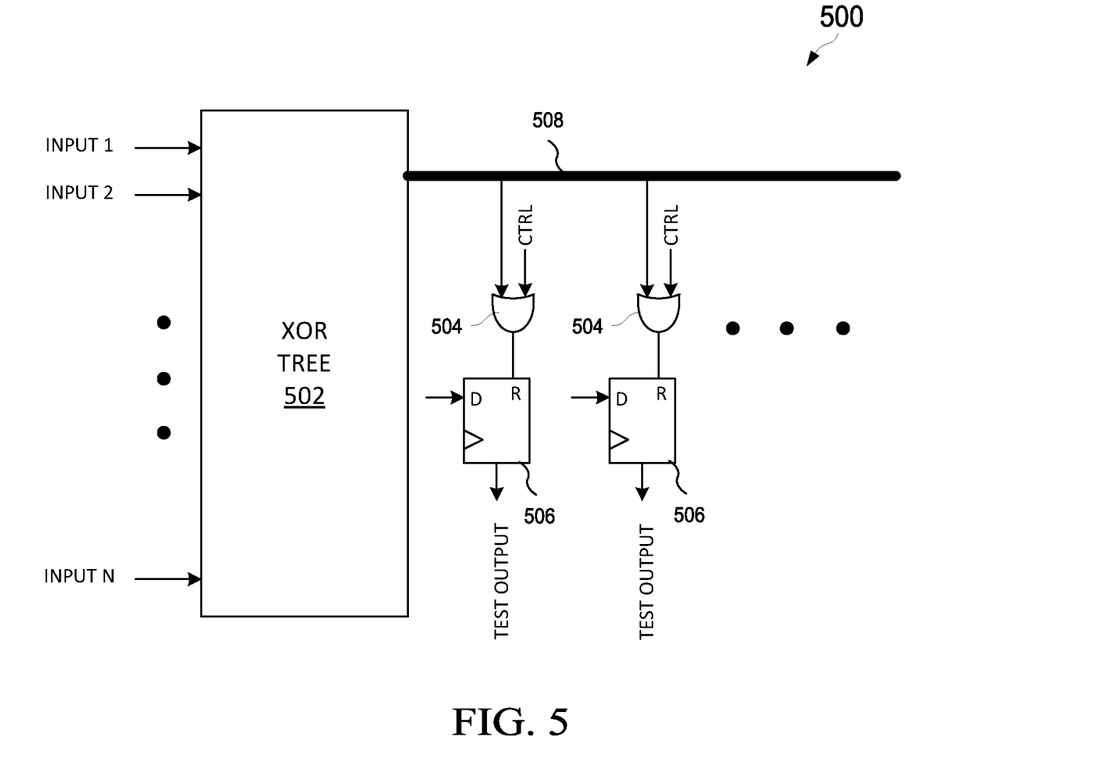
FIG. 5 is a block diagram of an embodiment circuit for testing uncovered functional combination logic of a digital circuit using existing boundary scan flip-flops.

FIG. 5 illustrates a block diagram of an embodiment circuit 500 for testing uncovered functional combination logic of a digital circuit using existing boundary scan flip-flops 506. Circuit 500 includes an XOR tree 502, OR gates 504, and existing boundary scan flip-flops 506, which may (or may not) be arranged as shown. Further, circuit 500 may include additional components not shown in FIG. 5.

In embodiments, XOR tree 502 consists of a series of XOR gates connected in a tree structure, with the output of each gate serving as the input to one or more child gates. The output of the XOR tree 502 is the result of the XOR operations performed by the gates in the tree.

In embodiments, XOR tree 502 is designed to perform desired operations on the input data by creating a series of logic gates connected in a tree structure. The output of each gate, in turn, serves as the input to one or more child gates. The output of the XOR tree would be the result of the XOR operations performed by the gates in the tree.

It should be noted that any data structure corresponding to an XOR tree, known in the arts, is contemplated. Further, the embodiments of this disclosure are not limited to using an XOR tree, and other approaches for implementing XOR operations in a digital circuit are contemplated.

In embodiments, the inputs (input 1, 2, . . . , N) are pad inputs of the digital circuit. Inputs (input 1, 2, . . . , N) of the XOR tree 502 are coupled to a respective uncovered functional combination logic near an output pad of the digital circuit, and the output of the XOR tree 502 provides a structural test result thereof. The output of the XOR tree 502 depends on the operations performed on the XOR tree 502; thus, different operations produce different outputs. The output of the XOR tree is coupled to a first input of an OR gate 504. A second input of the OR gate 504 is coupled to a control signal. It should be appreciated that the number of inputs and outputs of the XOR tree 502 are non-limiting.

The output of the OR gate 504 is coupled to a reset (R) pin of an existing boundary scan flip-flop 506. Generally, the existing boundary scan flip-flop 506 is designed to be non-resettable. However, in circuit 500, the existing boundary scan flip-flop 506 is designed to be resettable during the digital circuit design stage.

In contrast to circuit 200, which required the addition of the observability flip-flop 202, circuit 500 takes advantage of the existing boundary scan flip-flop near the uncovered functional combination logic; thus, circuit 500 has a minimal area impact. Further, in contrast to circuit 200, which added a new flip-flop to the scan chain and functional path, resulting in an increased scan chain and functional path length, circuit 500 does not suffer from increased test time or delays in the functional path.

In contrast to circuits 200 and 300, which are synchronous solutions, and require additional patterns in the digital circuit to meet setup and hold requirements, circuit 500 is an asynchronous solution, and coverage is obtained using the reset (R) pin of the existing boundary scan flip-flop 506.

Finally, the solution in circuit 500 does not require the purchasing of expensive software simulation tools to analyze uncovered functional combination logic.

Figure 6:
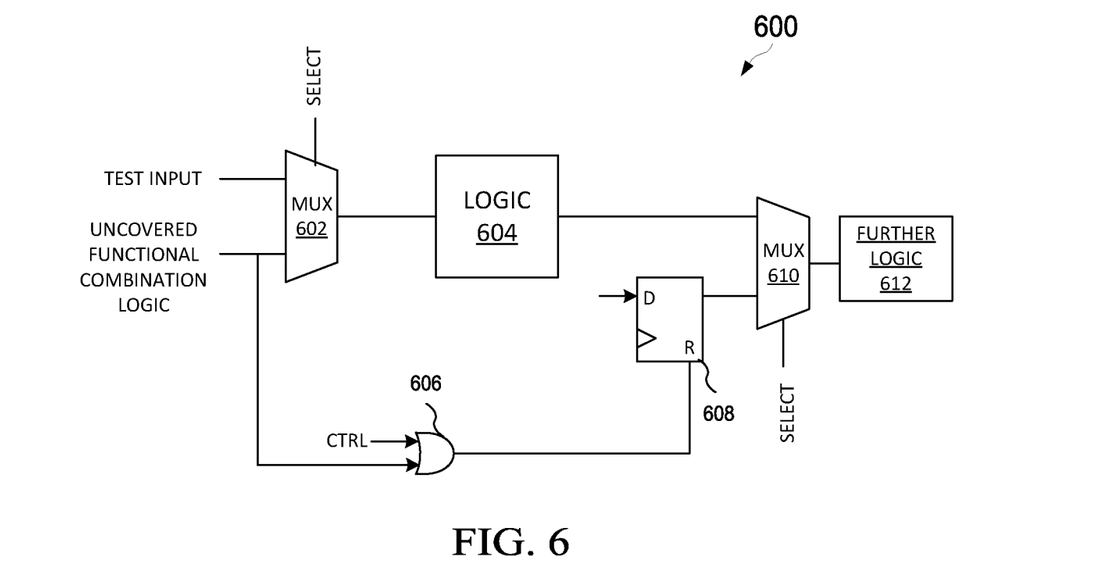
FIG. 6 is a block diagram of an embodiment circuit for testing the uncovered functional combination logic of a digital circuit using existing control flip-flops.

FIG. 6 illustrates a block diagram of an embodiment circuit 600 for testing the uncovered functional combination logic of a digital circuit using existing control flip-flops. Circuit 600 includes a first multiplexer 602, an uncovered logic circuit 604, an OR gate 606, a control flip-flop 608, and a second multiplexer 610, which may (or may not) be arranged as shown. The output of the multiplexer 61*o* is coupled to other logic circuits 612 of the digital circuit. Further, circuit 600 may include additional components not shown in FIG. 6.

In embodiments, the input to logic circuit 612 can be controlled based on the value loaded at the control flip-flop 608 during the scan shift or can be part of the testing of the uncovered functional combination logic of the digital circuit.

The uncovered logic circuit 604 corresponds to the analog IP of the digital circuit portion not covered by the scan chain during the scan mode test operation. In embodiments, the uncovered logic circuit 604 is an analog IP of the digital circuit, which is kept in a safe state (i.e., power down state) by forcing the analog IP digital inputs to a tied value.

For example, the analog IP is one of an ADC (e.g., successive successive-approximation ADC), a power management block, a flash, a fuse, a clock source (e.g., phase-locked loop, crystal oscillators, RC oscillators), a threshold detector, or a process monitor.

In embodiments, the uncovered functional combination logic corresponds to the digital circuit portion not covered by the scan chain during the scan mode test operation. In embodiments, the uncovered functional combination logic is the portion of the digital circuit driving the digital inputs of the uncovered logic circuit 604, such as an analog IP.

The multiplexer 602 has a first input operating as a tied input and a second input coupled to the uncovered functional combination logic. The multiplexer's tied input is coupled to the digital input of the uncovered logic circuit 604 (analog IP) during the scan mode (to keep the analog IP in the safe state such as in the power down state). In scan mode, the uncovered functional combination logic is not fed to the uncovered logic circuit 604 and is not covered through the scan chain. The multiplexer's second input is coupled to the uncovered logic circuit 604 in the functional mode to allow the analog IP functional operations.

Circuit 600 includes an OR gate 606 having a first input coupled to the uncovered functional combination logic. The uncovered functional combination logic is coupled to the reset (R) pin of the control flip-flop 608 to test the uncovered functional combination logic when the control signal at the second input of the OR gate 606 is at a low level "0". The control signal at the second input of the OR gate 606 is at a high level "1" when the circuit is in functional mode.

During scan mode, the output of the uncovered logic circuit 604 (e.g., analog IP) will be static as the analog IP is forced into the power-down state (e.g., by connecting the digital inputs to safe state values).

During functional mode, the output of the uncovered logic circuit 604 (e.g., analog IP) is the original output when the input to the uncovered logic circuit 604 (e.g., analog IP) is coupled to the uncovered functional combination logic.

During scan test mode (i.e., when the control signal at the OR gate 606 is at a logic low level), the output of the control flip-flop 608 can be monitored to determine faults within the uncovered functional combination logic.

Accordingly, in embodiments, by selecting between the output of the uncovered logic circuit 604 and the output of the control flip-flop 608 using the second multiplexer 610, circuit 600 can be used in functional mode, in analog IP test mode (to do an analog functional test of uncovered logic circuit 604), and in scan mode (to test uncovered functional combination logic).

In contrast to circuit 200, which required the addition of the observability flip-flop 202, circuit 600 takes advantage of the existing control flip-flop within the core logic of the digital circuit; thus, circuit 600 has a minimal area impact. Further, in contrast to circuit 200, which added a new flip-flop to the scan chain and functional path, resulting in an increased scan chain and functional path length, circuit 600 does not suffer from increased test time or delays in the functional path.

In contrast to circuits 200 and 300, which are synchronous solutions, and require additional patterns in the digital circuit to meet setup and hold requirements, circuit 600 is an asynchronous solution, and coverage is obtained using the reset (R) pin of the existing control flip-flop 608.

Finally, the solution in circuit 600 does not require the purchasing of expensive software simulation tools to analyze uncovered functional combination logic.

Figure 7:
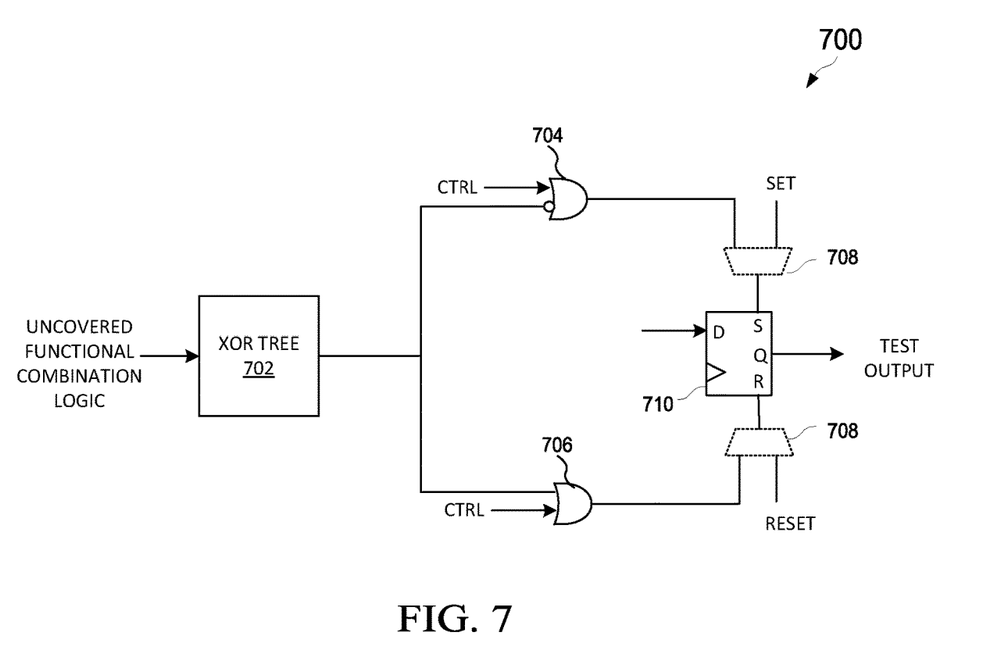
FIG. 7 is a block diagram of an embodiment circuit for testing the uncovered functional combination logic of a digital circuit.

FIG. 7 illustrates a block diagram of an embodiment circuit 700 for testing the uncovered functional combination logic of a digital circuit. Circuit 700 includes an XOR tree 702, an inverted-single input OR gate 704, an OR gate 706, a pair of optional multiplexers 708, and an existing D flip-flop 710, which may (or may not) be arranged as shown. Further, circuit 700 may include additional components not shown in FIG. 7.

In addition to the reset (R) pin, an existing D flip-flop set (S) pin may be used to test uncovered functional combination logic. An embodiment of this implementation is shown in circuit 700.

The input to the XOR tree 702 is coupled to uncovered functional combination logic. The first output of the XOR tree 702 is coupled to the inverted input of OR gate 704. The non-inverting input of the OR gate 704 is coupled to the control signal. The output of the OR gate 704 is coupled to the set (S) pin of the existing D flip-flop 710. In embodiments, a multiplexer 708 is used when the set (S) pin of the existing D flip-flop 710 is used a priori. The multiplexer 708, thus, allows the proper functioning of the existing D flip-flop 710 during the functional mode.

A second output of the XOR tree 702 is coupled to an input of the OR gate 706, and a second input of the OR gate 706 is coupled to the control signal. The output of the OR gate 706 is coupled to the reset (R) pin of the existing D flip-flop 710. In embodiments, a multiplexer 708 is used when the reset (R) pin of the existing D flip-flop 710 is used a priori. The multiplexer 708, thus, allows the proper functioning of the existing D flip-flop 710 during the functional mode.

Thus, in circuit 700, a single existing D flip-flop 710 is used to cover two output branches of the XOR tree 702.

Figure 8:
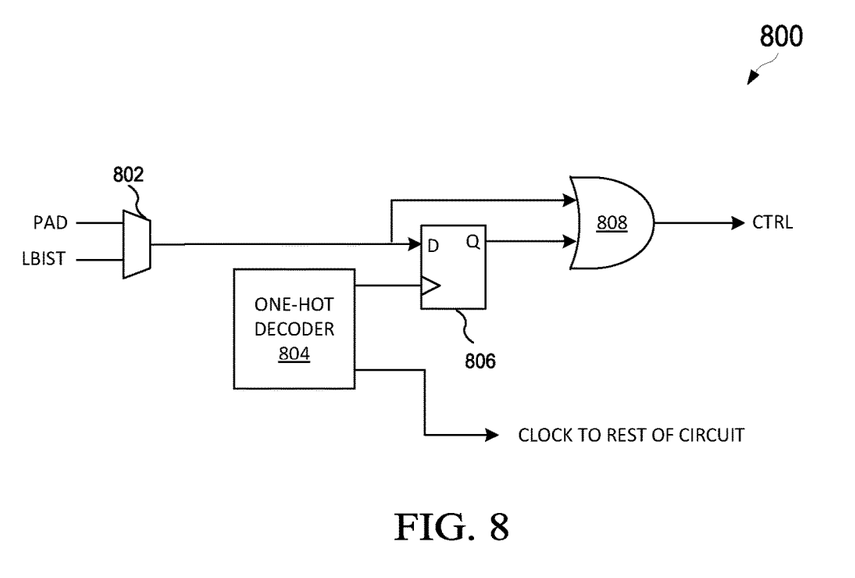
FIG. 8 is a block diagram of an embodiment circuit to generate the control signal for testing uncovered functional combination logic of a digital circuit.

FIG. 8 illustrates a block diagram of an embodiment circuit 800 to generate the control signal for testing uncovered functional combination logic of a digital circuit. Circuit 800 includes a multiplexer 802, a one-hot decoder circuit 804, a pipeline flip-flop 806, and an OR gate 808, which may (or may not) be arranged as shown. Further, circuit 80o may include additional components not shown in FIG. 8.

Multiplexer 802 is used to select between (i) a pad of the digital circuit during ATPG functions or functional mode, and (ii) LBIST control mode (e.g., during LBIST functions where the testing of the uncovered functional combination logic is required in both ATPG and LBIST).

In functional mode, the output of the multiplexer is tied to the pad of the digital circuit with a value of Not Care (N/C) because the pipeline flip-flop 806 is set to "1" at power-up and remains at this value since no clock signal is allowed from the one-hot decoder 804 to the pipeline flip-flop 806.

The data input of the pipeline flip-flop 806 is coupled to the multiplexer 802. The clock input of the pipeline flip-flop 806 is coupled to the output of the one-hot decoder circuit 804. The value of the one-hot decoder circuit 804 is loaded during a scan shift (i.e., pipeline flip-flop 806 is set to "1" during power-up and remains "1" during the shift as PAD is forced to "1" during the ATPG scan shift, and LBIST control is forced to "1" during the LBIST scan shift). Further, the value of the one-hot decoder circuit 804 is held during the scan capture (i.e., pipeline flip-flop 806 is set to "0" as PAD is forced to "0" during the ATPG scan capture and LBIST control is forced to "0" during the LBIST scan capture).

In embodiments, the pipeline flip-flop 806 is set to "1" during a power-up sequence of the digital circuit. This sets the control signal at the output of the OR gate 808 at a high level during non-test modes (e.g., functional mode). In embodiments, the pipeline flip-flop 806 does not receive a clock signal from one-hot decoder circuit 804 during non-test modes (e.g., functional mode).

In embodiments, the OR gate 808 includes a third input coupled to a transition signal. The transition signal allows the at-speed testing operation using ATPG or LBIST functions. The value of the transition signal is forced to "0" during all other operations, for example, during stuck-at testing, functional mode, and the like.

Circuit 800 effectively allows the LBIST to dictate the value of the control signal or ATPG signal to dictate the value of PAD during the testing of the uncovered functional combination logic.

In embodiments, the output of the OR gate 808 is coupled to the inputs of the OR gate 402 in circuit 400, OR gate 504 in circuit 500, OR gate 606 in circuit 600, and the OR gates 704 and 706 in circuit 700.

It should be appreciated that generating the control signal using circuit 800 is non-limiting and other circuits for generating the control signal are also contemplated.

In embodiments, the one-hot decoder circuit 804, the OR gate 808, and the pipeline flip-flop 806 are existing components of the digital circuit. Thus, the circuit footprint is not increased by using the existing components to generate the control signal.

Advantageously, generating the control signal using circuit 800 with the one-hot decoder circuit 804 and the pipeline flip-flop 806 internal to the digital circuit removes the need for a separate control pad in the digital circuit, which results in costs savings in a high-parallelism test environment.

Further, the internal generating of the control signal helps to use the logic in LBIST. Generally, LBIST is a fully internal test, which does not control a pad of the digital circuit nor is it used to observe the pad. During the LBIST control mode, the LBIST controller IP input is provided at the output of OR gate 808.

In embodiments, a single circuit 800 generates a control signal fed (i.e., through a direct or indirect net connection from the output of OR gate 808) to the inputs of the OR gate 402 in circuit 400, OR gate 504 in circuit 500, OR gate 606 in circuit 600, and the OR gates 704 and 706 in circuit 700 for the various digital circuits to test uncovered functional combinational logic. In response to the control signal from circuit 800 being set to zero "0", the various uncovered functional combinational logic are, thus, tested.

Figure 9:
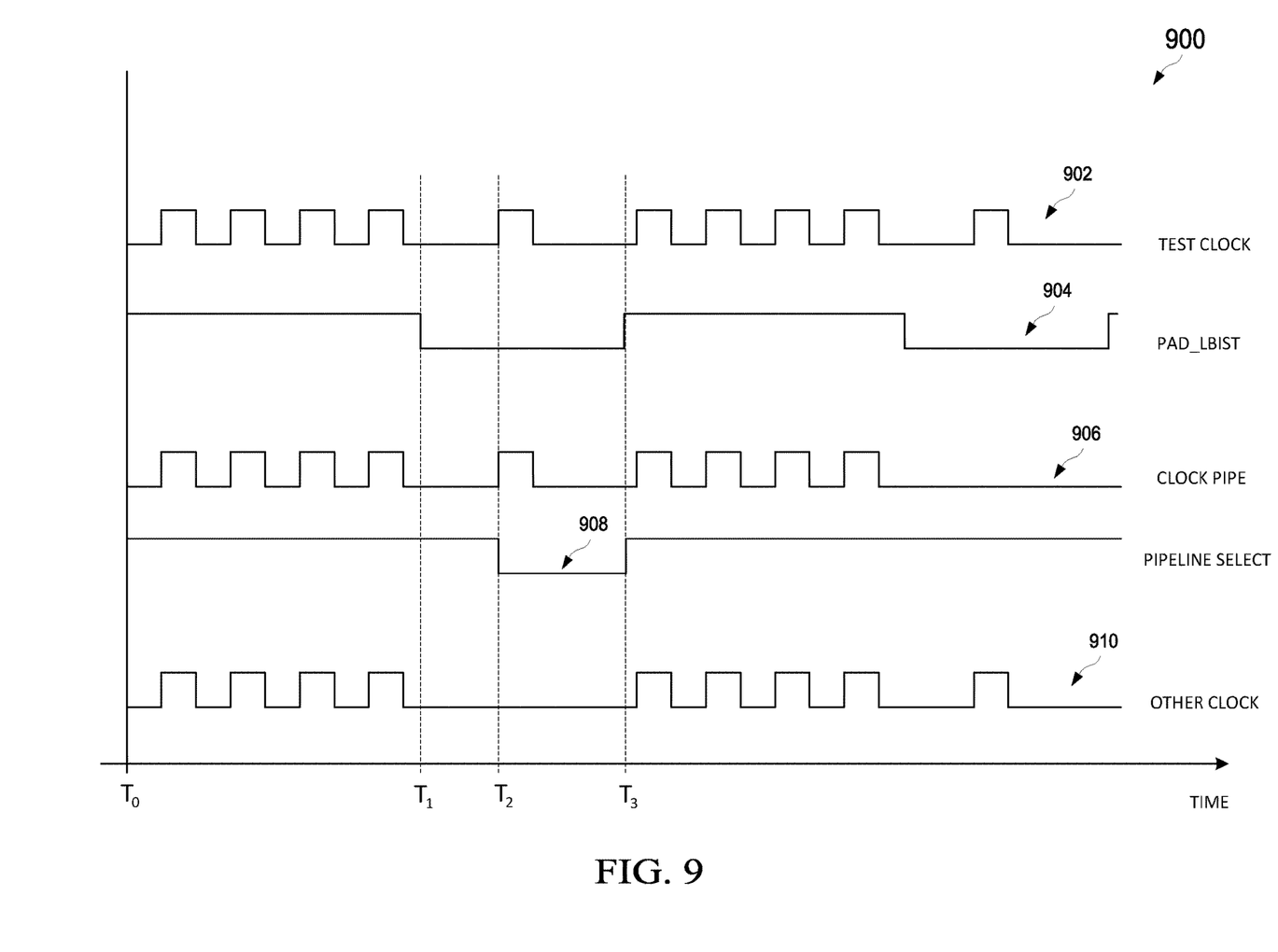
FIG. 9 is a timing diagram of embodiment signals of a digital circuit for testing uncovered functional combination logic.

FIG. 9 is a timing diagram of embodiment signals 900 of a digital circuit for testing uncovered functional combination logic. Signals 900 include test clock signal 902, pad_lbist signal 904, clock pipe signal 906, pipeline select signal 908, and other clock signal 910.

Test clock signal 902 is the clock signal used for ATPG and LBIST testing. Pad_lbist signal 904 is the signal fed to multiplexer 802 to select between a pad and the LBIST. Clock pipe signal 906 is the clock signal from one-hot decoder circuit 804 to the pipeline flip-flop 806. Pipeline select signal 908 is the output signal from the pipeline flip-flop 806 to OR gate 808. Other clock signal 910 is the clock signal communicated from the one-hot decoder circuit 804 to other portions of the digital circuit.

Between times $T_0$ and $T_1$, test clock signal 902, clock pipe signal 906, and other clock signal 910 operate as a typical clock signal, and pad_lbist signal 904 and pipeline select signal 908 are set to a high level, which sets the control signal at a high level-when the control signal is set to a high level, the uncovered functional combination logic is not being tested.

At time $T_1$, the pad_lbist signal 904 is pulled low. The one-hot decoder circuit 804 begins control operation. Test clock signal 902, clock pipe signal 906, and other clock signal 910 are pulled low.

At time $T_2$, the pipeline select signal 908 is pulled low in response to the clock pipe signal 906 being asserted, which results in the control signal being placed in the condition for testing the uncovered functional combination logic of the digital circuit.

At time $T_3$, the pipeline select signal 908 is pulled high, which results in the control signal exiting the condition for testing the uncovered functional combination logic of the digital circuit.

After time $T_3$, the pipeline select signal 908 remains high, and the other clock signal 910 is used to operate the other portions of the digital circuit.

Figure 10:
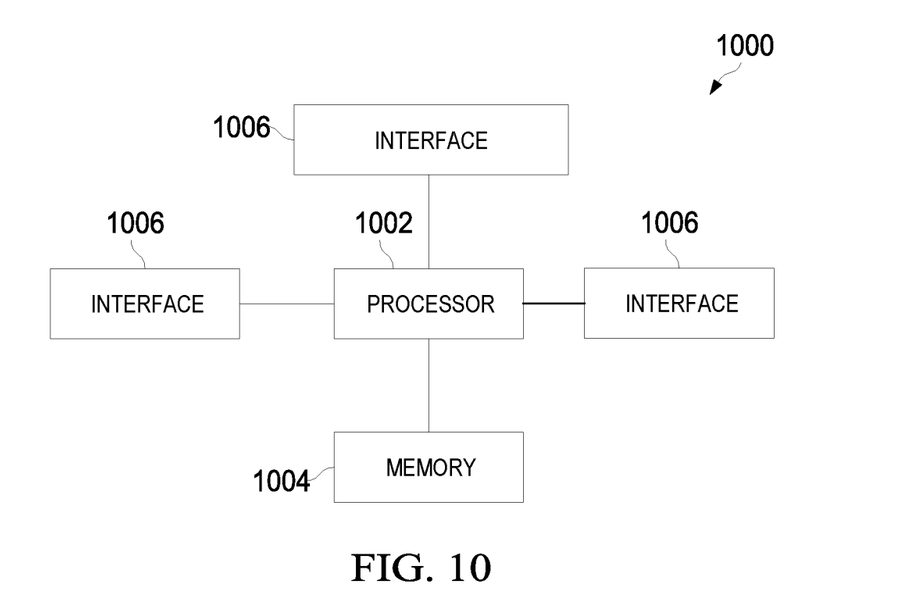
FIG. 10 is a block diagram of an embodiment processing system.

FIG. 10 illustrates a block diagram of an embodiment processing system 1000. As shown, the processing system 1000 includes a processor 1002, a memory 1004, and an interface 1006, which may (or may not) be arranged as shown. The processing system 1000 may include additional components not depicted, such as long-term storage (e.g., non-volatile memory, etc.), measurement devices, and the like.

Processor 1002 may be any component or collection of components adapted to perform computations or other processing related tasks, as disclosed herein. Memory 1004 may be any component or collection of components adapted to store programming or instructions for execution by the processor 1002. In an embodiment, memory 1004 includes a non-transitory computer-readable medium.

Interface 1006 may be any component or collection of components that allow the processor 1002 to communicate with other devices/components or a user. For example, interface 1006 may be adapted to allow a user or device (e.g., personal computer (PC), etc.) to interact/communicate with the processing system 1000.

It is noted that all steps outlined, as disclosed in this disclosure, are not necessarily required and can be optional. Further, changes to the arrangement of the steps, removal of one or more steps and path connections, and addition of steps and path connections are similarly contemplated.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A digital circuit, comprising:
   an OR gate having a first input and a second input, the first input coupled to a control signal, the second input coupled to an uncovered functional combination logic of the digital circuit, wherein the first input of the OR gate is configured to be pulled low by the control signal in response to setting the digital circuit in a configuration to test the uncovered functional combination logic; and
   a flip-flop having a reset pin or a set pin coupled to an output of the OR gate, wherein an output of the flip-flop is configured to be observed during a testing of the uncovered functional combination logic to detect defects in the digital circuit, wherein the flip-flop is a boundary scan flip-flop or a control flip-flop of the digital circuit.

2. The digital circuit of claim 1, wherein, in response to the reset pin or the set pin being pulled high during the testing of the uncovered functional combination logic, a last scan shift value of the flip-flop is overridden, and wherein a stuck-at "1" fault condition is observed for the uncovered functional combination logic at the output of the flip-flop.

3. The digital circuit of claim 1, wherein, in response to the reset pin or the set pin remaining low during the testing of the uncovered functional combination logic, a last scan shift value of the flip-flop is retained, and wherein a stuck-at "0" fault condition is observed for the uncovered functional combination logic at the output of the flip-flop.

4. The digital circuit of claim 1, further comprising:
   a multiplexer having a first input and a second input, the first input coupled to a pad of the digital circuit, and the second input coupled to an LBIST control signal, an output of the multiplexer coupled to the LBIST control signal during LBIST in response to setting the digital circuit in the configuration to test the uncovered functional combination logic, and the output of the multiplexer coupled to a pad of the digital circuit during ATPG functions;
   a one-hot decoder circuit configured to generate a first clock signal and second clock signals, the second clock signals provided to the rest of the digital circuit;
   a second flip-flop having a clock input, a data input, and an output, the clock input coupled to the output of the one-hot decoder circuit and configured to receive the first clock signal, and the data input coupled to the output of the multiplexer; and
   a second OR gate coupled to the output of the second flip-flop, wherein the second OR gate is configured to generate the control signal in response to setting the digital circuit in the configuration to test the uncovered functional combination logic.

5. The digital circuit of claim 1, further comprising a multiplexer arranged between the output of the OR gate and the reset pin or the set pin of the flip-flop, wherein the multiplexer is configured to couple the OR gate to the flip-flop in response to setting the digital circuit in the configuration to test the uncovered functional combination logic.

6. The digital circuit of claim 1,
   wherein, in response to the reset pin or the set pin being pulled high during the testing of the uncovered functional combination logic, a last scan shift value of the flip-flop is overridden, and wherein, in response to the reset pin or the set pin remaining low during the testing of the uncovered functional combination logic, a last scan shift value of the flip-flop is retained.

7. The digital circuit of claim 1,
wherein, in response to the reset pin or the set pin being pulled high during the testing of the uncovered functional combination logic, a stuck-at "1" fault condition is observed for the uncovered functional combination logic at the output of the flip-flop, and
wherein, in response to the reset pin or the set pin remaining low during the testing of the uncovered functional combination logic, a stuck-at "0" fault condition is observed for the uncovered functional combination logic at the output of the flip-flop.

8. A digital circuit for testability, the digital circuit comprising:
a multiplexer having a first input, a second input, and an output;
a one-hot decoder circuit configured to generate a first clock signal and second clock signals;
a pipeline flip-flop having a clock input coupled to receive the first clock signal from the one-hot decoder circuit, a data input coupled to the output of the multiplexer, and an output;
a control OR gate having a first input coupled to the output of the pipeline flip-flop and an output configured to generate a control signal;
a functional combination logic circuit;
a test OR gate having a first input coupled to the control signal from the control OR gate and a second input coupled to the functional combination logic circuit; and
a second flip-flop having a reset pin or a set pin coupled to an output of the test OR gate, and an output configured to be observed during testing,
wherein the multiplexer is configured to select between a pad input and a Logic Built-In Self-Test (LBIST) control signal based on a test mode of the digital circuit.

9. The digital circuit of claim 8, wherein, in response to the reset pin or the set pin being pulled high during testing of the functional combination logic circuit, the second flip-flop is configured to:
override a last scan shift value; and
output a signal indicating a stuck-at "1" fault condition for the functional combination logic circuit.

10. The digital circuit of claim 8, wherein, in response to the reset pin or the set pin remaining low during testing of the functional combination logic circuit, the second flip-flop is configured to:
retain a last scan shift value; and
output a signal indicating a stuck-at "0" fault condition for the functional combination logic circuit.

11. The digital circuit of claim 8, wherein the second flip-flop is a boundary scan flip-flop configured to test the functional combination logic circuit near an output pad of the digital circuit.

12. The digital circuit of claim 8, wherein the second flip-flop is a control flip-flop configured to test the functional combination logic circuit within core logic of the digital circuit.

13. The digital circuit of claim 8, wherein the second flip-flop is a resettable functional flip-flop of the digital circuit.

14. The digital circuit of claim 8, further comprising a second multiplexer having a first input coupled to the output of the test OR gate, a second input coupled to a reset signal, and an output coupled to the reset pin or the set pin of the second flip-flop, wherein the second multiplexer is configured to select between the output of the test OR gate and the reset signal based on an operational mode of the digital circuit.

15. A method for testing a digital circuit, the method comprising:
coupling a first input of an OR gate to a control signal;
coupling a second input of the OR gate to an uncovered functional combination logic of the digital circuit;
configuring the first input of the OR gate to be pulled low by the control signal in response to setting the digital circuit in a configuration to test the uncovered functional combination logic;
coupling an output of the OR gate to a reset pin or a set pin of a flip-flop, the flip-flop being a boundary scan flip-flop or a control flip-flop of the digital circuit; and
observing an output of the flip-flop during testing of the uncovered functional combination logic to detect defects in the digital circuit.

16. The method of claim 15, further comprising:
overriding a last scan shift value of the flip-flop in response to the reset pin or the set pin being pulled high during the testing of the uncovered functional combination logic; and
observing a stuck-at "1" fault condition for the uncovered functional combination logic at the output of the flip-flop.

17. The method of claim 15, further comprising:
retaining a last scan shift value of the flip-flop in response to the reset pin or the set pin remaining low during the testing of the uncovered functional combination logic; and
observing a stuck-at "o" fault condition for the uncovered functional combination logic at the output of the flip-flop.

18. The method of claim 15, further comprising testing the uncovered functional combination logic near an output pad of the digital circuit using the boundary scan flip-flop.

19. The method of claim 15, further comprising testing the uncovered functional combination logic within core logic of the digital circuit using the control flip-flop.

20. The method of claim 15, further comprising:
arranging a multiplexer between the output of the OR gate and the reset pin or the set pin of the flip-flop;
coupling the OR gate to the flip-flop through the multiplexer in response to setting the digital circuit in the configuration to test the uncovered functional combination logic; and
coupling a reset signal to the flip-flop through the multiplexer during normal operation of the digital circuit.

* * * * *

UNITED STATES PATENT AND TRADEMARK OFFICE
CERTIFICATE OF CORRECTION

| | | |
|---|---|---|
| PATENT NO. | : 12,366,605 B2 | Page 1 of 1 |
| APPLICATION NO. | : 18/100975 | |
| DATED | : July 22, 2025 | |
| INVENTOR(S) | : Venkata Narayanan Srinivasan et al. | |

It is certified that error appears in the above-identified patent and that said Letters Patent is hereby corrected as shown below:

In the Claims

In Column 18, Line 41, Claim 17:
Change "observing a stuck-at "o" fault condition"
To --observing a stuck-at "0" fault condition--

Signed and Sealed this
Ninth Day of September, 2025

Coke Morgan Stewart
*Acting Director of the United States Patent and Trademark Office*